(12) United States Patent
Gian

(10) Patent No.: US 9,207,021 B2
(45) Date of Patent: Dec. 8, 2015

(54) GEOTHERMAL AIR CONDITIONING FOR ELECTRICAL ENCLOSURE

(75) Inventor: Michael Gian, Garden City, KS (US)

(73) Assignee: Michael Gian, Garden City, KS (US)

( * ) Notice: Subject to any disclaimer, the term of this patent is extended or adjusted under 35 U.S.C. 154(b) by 778 days.

(21) Appl. No.: 12/564,018

(22) Filed: Sep. 21, 2009

(65) Prior Publication Data

US 2010/0200210 A1    Aug. 12, 2010

Related U.S. Application Data

(60) Provisional application No. 61/150,794, filed on Feb. 8, 2009.

(51) Int. Cl.
| | | |
|---|---|---|
| *F25D 23/12* | (2006.01) | |
| *F28D 20/00* | (2006.01) | |
| *F24J 3/08* | (2006.01) | |
| *H05K 7/20* | (2006.01) | |
| *F24F 5/00* | (2006.01) | |
| *F28D 15/00* | (2006.01) | |

(52) U.S. Cl.
CPC .............. *F28D 20/0052* (2013.01); *F24J 3/081* (2013.01); *F24J 3/085* (2013.01); *H05K 7/20609* (2013.01); *F24F 2005/0057* (2013.01); *F28D 15/00* (2013.01); *Y02B 10/40* (2013.01); *Y02E 10/12* (2013.01); *Y02E 10/14* (2013.01); *Y02E 60/142* (2013.01); *Y02E 70/30* (2013.01); *Y10T 29/49826* (2015.01)

(58) Field of Classification Search
CPC .. F24F 11/00; F24F 2005/0057; F25D 23/12; F24J 3/08; F24J 3/081; F24J 3/085; B23P 11/00; F28D 20/0052; F28D 15/00; H05K 7/20609; Y10T 29/49826; Y02E 10/12; Y02E 10/14; Y02E 60/142; Y02E 70/30; Y02B 10/40
USPC ........ 62/260, 259.2; 165/45, 47, 247; 29/248; 312/223.1, 223.2, 236
See application file for complete search history.

(56) References Cited

U.S. PATENT DOCUMENTS

| | | |
|---|---|---|
| 2,167,878 A | 2/1936 | Crawford |
| 2,165,854 A | 7/1938 | Headrick |
| 2,299,531 A | 11/1938 | Crawford |
| 2,503,456 A | 10/1945 | Smith |
| 2,461,449 A | 10/1946 | Smith et al. |
| 3,236,296 A | 2/1966 | Dubin |

(Continued)

FOREIGN PATENT DOCUMENTS

JP    2005-233527    2/2005

OTHER PUBLICATIONS

"GeoExchange Units", website: http://www.wellowner.org/aother/heating.shtml; printed Dec. 5, 2008; 11 pages.

(Continued)

*Primary Examiner* — Travis Ruby
(74) *Attorney, Agent, or Firm* — IP Law Leaders, PLLC

(57) ABSTRACT

An electrical equipment cabinet coupled to a closed loop in turn coupled to a groundwater source for exchanging heat energy with the closed loop for air-conditioning the interior of the electrical equipment cabinet. In the absence of a groundwater source a slinky loop is used as a substitute. The slinky loop is buried in the ground or located in a body of water located on or below ground.

6 Claims, 18 Drawing Sheets

(56) References Cited

U.S. PATENT DOCUMENTS

| | | | |
|---|---|---|---|
| 3,396,780 A * | 8/1968 | Koltuniak et al. | 165/47 |
| 4,042,012 A * | 8/1977 | Perry et al. | 165/45 |
| 4,313,310 A * | 2/1982 | Kobayashi et al. | 62/175 |
| 4,325,228 A | 4/1982 | Wolf | |
| 4,427,055 A | 1/1984 | Heavener | |
| 4,448,237 A | 5/1984 | Riley | |
| 5,467,250 A | 11/1995 | Howard et al. | |
| 5,978,218 A * | 11/1999 | Fujimoto et al. | 361/696 |
| 6,006,944 A * | 12/1999 | Machledt | 220/567.1 |
| 6,138,744 A | 10/2000 | Coffee | |
| 6,450,247 B1 | 9/2002 | Raff | |
| 6,628,520 B2 | 9/2003 | Patel et al. | |
| 6,924,981 B2 * | 8/2005 | Chu et al. | 361/696 |
| 7,124,597 B2 | 10/2006 | Kattner et al. | |
| 2006/0213637 A1 * | 9/2006 | Laroche | 165/45 |
| 2006/0225449 A1 * | 10/2006 | Dorrich et al. | 62/259.2 |
| 2007/0271940 A1 * | 11/2007 | Yang | 62/260 |
| 2008/0212282 A1 | 9/2008 | Hall et al. | |
| 2008/0289795 A1 * | 11/2008 | Hardin et al. | 165/45 |

OTHER PUBLICATIONS

"GeoExchange Units—Additional Topics", website: http://www.wellowner.org/aother/heatingindex.shtml; printed Dec. 5, 2008; 1 page.

"Ground Source Heating and Cooling", website: http://www.soundgt.com/earth.htm; printed Dec. 5, 2008; 4 pages.

"Ground water cooling", website: http://www.bsjonline.co.uk/story.asp?sectioncode=197&storycode=3051801&c=1; printed Dec. 5, 2008; 3 pages.

\* cited by examiner

| TABLE 1 ||
|---|---|
| circulating pathway *CP* ||
| groundwater *GW* ||
| ground *G* ||
| body of water *BW* ||
| PART # | DESCRIPTION |
| 100 | electrical equipment cabinet |
| 110 | closed loop |
| 112 | heat-generating electrical equipment |
| 114 | housing |
| 120 | primary enclosure |
| 140 | secondary enclosure |
| 160 | internal dividing wall |
| 170 | radiator |
| 180 | a first aperture |
| 200 | a second aperture |
| 220 | first fan |
| 240 | second fan |
| 260 | closed-loop pump |
| 280 | first working fluid line |
| 285 | outlet port |
| 300 | second working fluid line |
| 305 | inlet port |
| 320 | thermostat |
| 340 | heat exchanger portion |
| 340s | slinky loop |
| 360 | groundwater discharge line |

*Fig. 11*

| TABLE 1 (continued) ||
|---|---|
| PART # | DESCRIPTION |
| 370 | ground water discharge line 360 defines an open exit end 370 |
| 380 | ground water pump 380 |
| 400 | ground water pump motor 400 |
| 404 | groundwater pump unit 404 |
| 410 | groundwater motor housing 410 |
| 420 | programmable controller 420 |
| 440 | keyboard 440 |
| 460 | processor 460 |
| 480 | memory 480 |
| 500 | humidity control apparatus 500 |

*Fig. 11A*

GEOTHERMAL AIR CONDITIONING FOR ELECTRICAL ENCLOSURE

CROSS-REFERENCE TO RELATED APPLICATIONS

This application claims the benefit of priority from U.S. Provisional Patent Application Ser. No. 61/150,794 (filed Feb. 8, 2009), the entire contents of which is incorporated herein by reference.

STATEMENT REGARDING FEDERALLY SPONSORED RESEARCH OR DEVELOPMENT

Not Applicable.

FIELD OF THE INVENTION

This invention relates to geothermal air conditioning for outdoor electrical equipment cabinets. More specifically, the invention is directed to apparatus for controlling the temperature, and optionally humidity, inside an electrical equipment cabinet housing heat-generating electrical equipment.

BACKGROUND OF THE INVENTION

Outdoor electrical equipment cabinets are often used to protect sensitive electrical or electronic equipment from, for example, adverse environmental conditions. One common use for outdoor cabinets is to house telephone equipment. Outdoor cabinets are also used to protect other kinds of electrical equipment for monitoring industrial plant at sites such as oil refineries, remote industrial plant locations, and irrigation wells delivering water to meet agricultural needs at remote locations.

The electrical equipment housed in the cabinets require ambient temperature conditions to operate over long periods of time and need to be protected from unwanted contamination such as humidity and particulate matter. Electrical equipment, such as electrical control equipment, generates heat inside the cabinet. Prior art systems for controlling the temperature inside electrical cabinets rely on such things as fans ducting atmospheric air from outside the cabinet to cool the electrical equipment inside the cabinet.

Such systems of cooling present many problems. Outside air may be too hot to cool the electrical equipment. The outside air might be contaminated with humidity and particulate matter. Filters might be employed to filter the air ducted into the prior art electrical enclosures, but this can present a problem since filters have to be changed and the electrical enclosure might be situated at a remote location.

Therefore, there is a need for a solution that does not involve using air outside the electrical equipment cabinet to cool the electrical equipment inside the enclosure.

SUMMARY OF THE INVENTION

An electrical equipment cabinet coupled to a closed loop in turn coupled to a groundwater source for exchanging heat energy with the closed loop for air-conditioning the interior of the electrical equipment cabinet. In the absence of a groundwater source a slinky loop is used as a substitute. The slinky loop is buried in the ground or located in a body of water located on or below ground.

BRIEF DESCRIPTION OF THE DRAWINGS

FIGS. 11 and 11A show Table 1.

DETAILED DESCRIPTION

Figure 1:
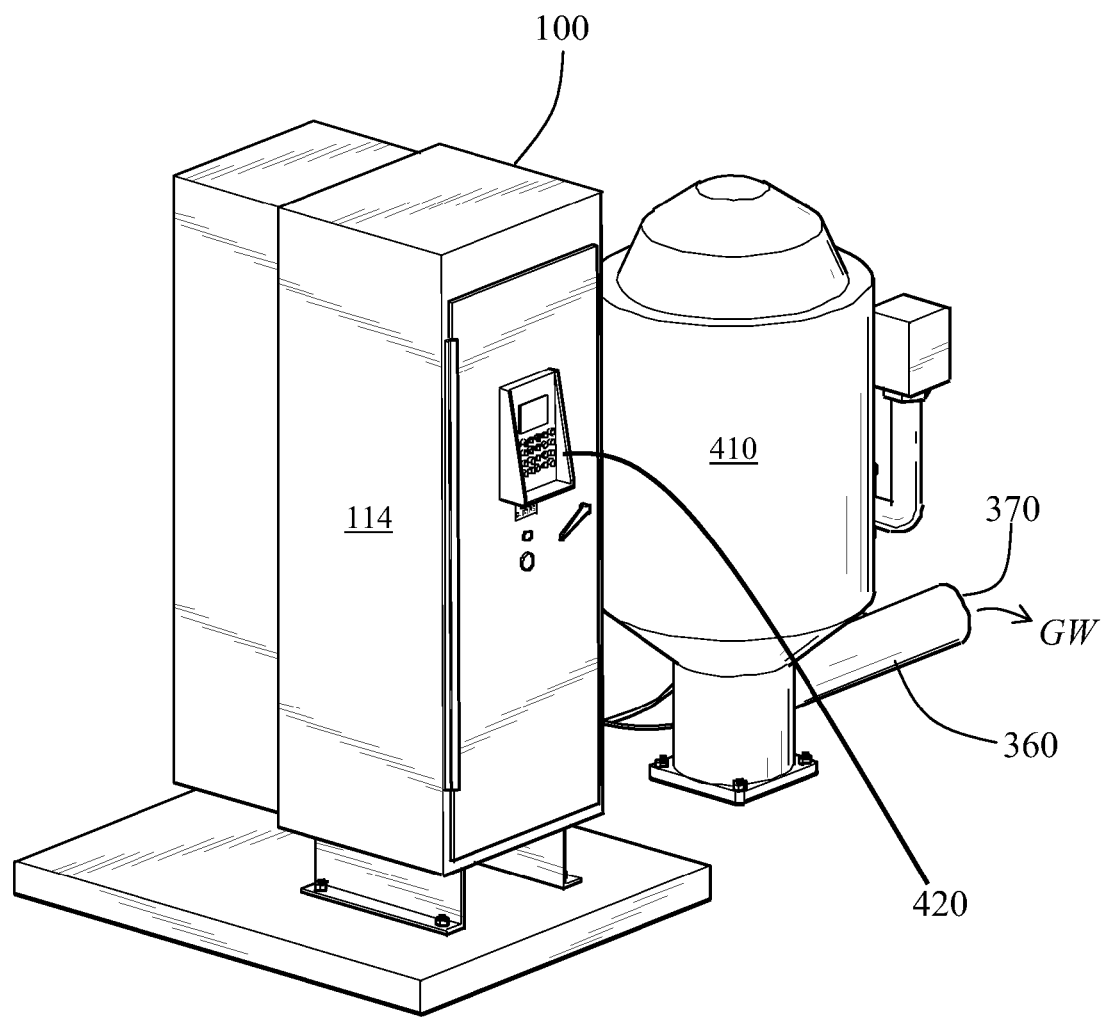
FIG. 1 shows an elevated perspective front view of an electrical equipment cabinet setup according to the present invention.

This invention is directed to a geothermal air conditioning system for outdoor electrical equipment cabinets. More specifically, the invention is directed to an apparatus for providing cooling or heating, depending on local weather conditions, to the interior of an electrical equipment cabinet 100 housing electrical equipment 112; for example, a remotely located electrical equipment cabinet 100.

In a first embodiment of the invention, a closed loop 110 is coupled to an electrical equipment cabinet 100 and to a groundwater supply, which in hot weather is used as a heat sink to cool working fluid (i.e., heat transfer fluid) inside the closed loop 110, which in turn is used to cool the electrical equipment 112; and in cold weather the groundwater supply is used as a heat source to heat the working fluid inside the closed loop 110, which in turn is used to provide heat energy to the interior of an electrical equipment cabinet 100 housing heat-generating equipment 112.

In another embodiment, the closed loop 110 includes a slinky loop 340s. The slinky loop 340s is buried underground or located in a body of water. In hot weather the slinky loop 340s is used to transfer heat from the closed loop 110, and hence from the interior of the electrical equipment cabinet 100, to the ground or a body of water. In cold weather the slinky loop 340s is used to transfer heat from the ground or a body of water to the closed loop 110 and thence to the interior of the electrical equipment cabinet 100.

In one aspect of the invention an electrical equipment cabinet 100 comprises a housing 114. A primary enclosure 120 and a secondary enclosure 140 are located inside housing 114. The primary 120 and secondary 140 enclosures are adjacent to each other (see, e.g., FIG. 6) and are separated by an internal dividing wall 160. The primary enclosure 120 contains the heat-generating electrical equipment 112 therein. The secondary enclosure 140 houses a radiator 170. During hot weather the radiator 170 cools air inside the cabinet 100 and during cold weather the radiator 170 provides heat to the air inside the cabinet 100. The radiator 170 can be any suitable device for exchanging heat energy such as a radiator of the kind found in hydrocarbon powered automobiles.

The electrical equipment cabinet 100 can be sealed to prevent incursion of outside air into the housing 114 and the air inside the housing 114, and hence inside cabinet 100, is replaced with a gas or gas combination that lacks oxygen, for example: nitrogen or an inert gas such as a Noble gas such as helium (He), neon (Ne), argon (Ar), krypton (Kr), xenon (Xe) to further protect the electrical equipment 112 therein. More specifically, the air that would normally be present and circulated around primary and secondary enclosures 120 and 140 is replaced with a noble gas. Alternatively, instead of air circulated around the primary 120 and secondary enclosure 140, nitrogen is circulated around the primary 120 and secondary enclosure 140 to reduce oxidation of the interior of the housing and to reduce oxidation of circuits that form part of the electrical equipment 112. Alternatively, an inert gas such as helium or argon is circulated around the primary 120 and secondary enclosure 140 inside housing 114.

Figure 6:
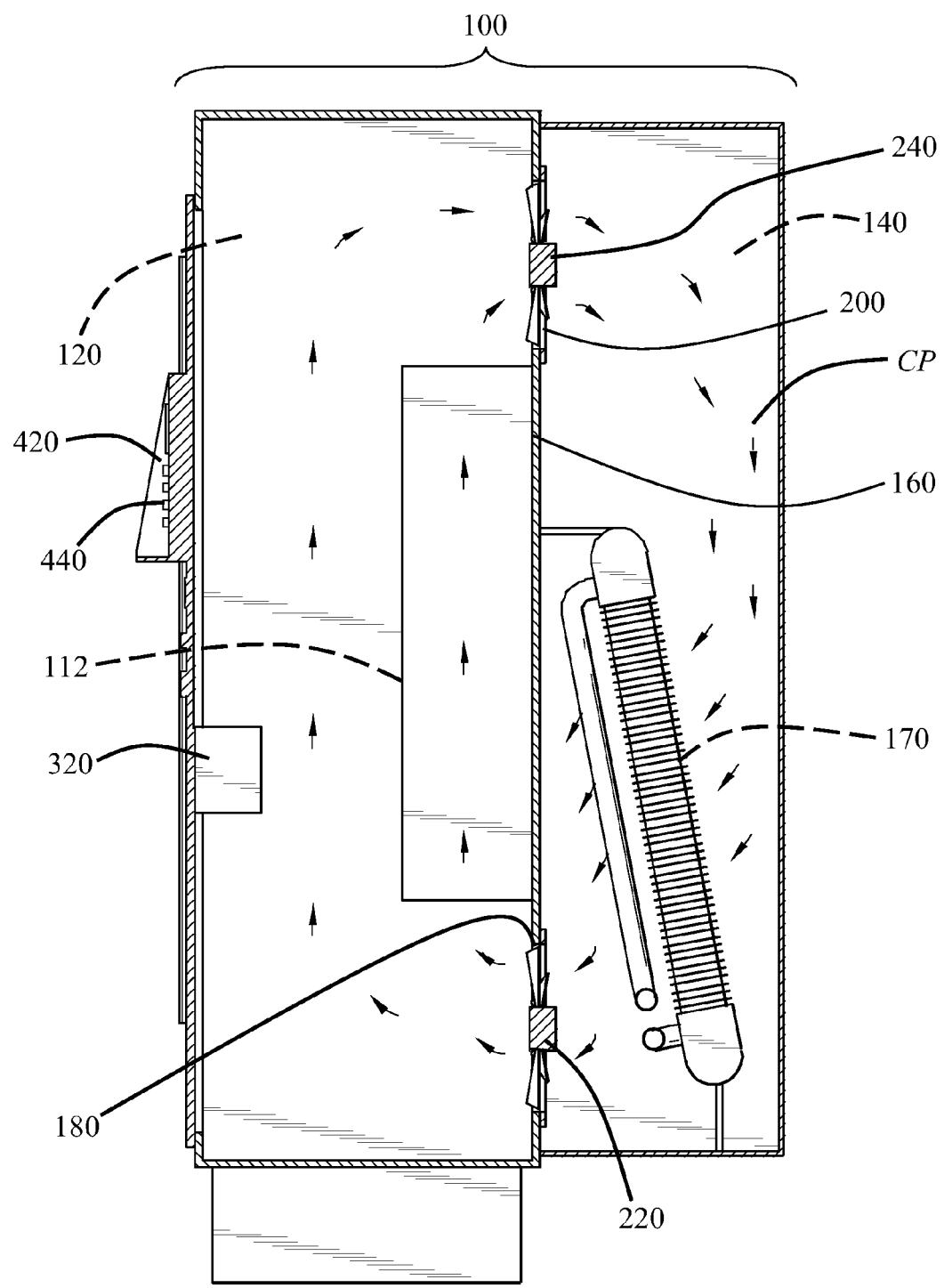
FIG. 6 shows a cross-section view of an electrical equipment cabinet setup according to the present invention.
Figure 6A:
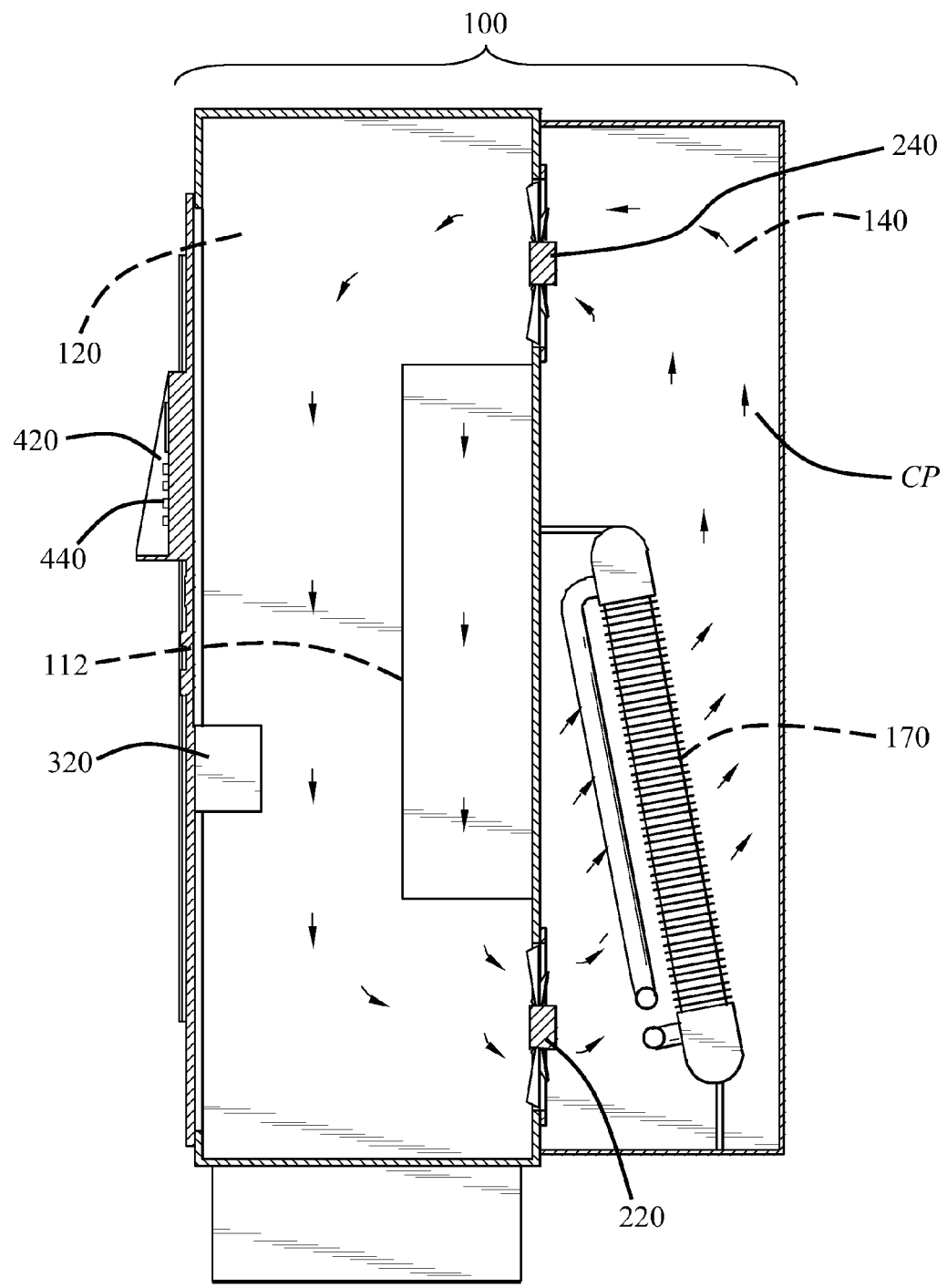
FIG. 6A shows a cross-section view of an electrical equipment cabinet setup according to the present invention.

In a preferred embodiment there is a plurality of apertures located in the internal dividing wall 160. For example, in FIG. 6 first and second apertures 180 and 200 are located in the internal dividing wall 160 separating the primary and secondary enclosures 120 and 140. Air flow is directed through the first and second apertures 180 and 200 as shown in FIG. 6. Alternatively, air flow is directed in the opposite direction as shown in FIG. 6A. The exact location of the first and second apertures 180 and 200 is not critical, but they should be located to allow air to flow into and out of the primary enclosure 120 via the secondary enclosure 140.

It is preferred that the radiator 170 is of the kind that allows air to flow through the radiator 170. For example, the radiator 170 can be an air penetrable radiator of the kind used to cool internal combustion engines. It is preferred that the air cooled by the radiator 170 travels the shortest distance possible between the radiator 170 and the primary enclosure 120. Hence, it is preferred that the air is circulated through the first aperture 180 in the direction of the primary enclosure 120 as shown, for example, in FIG. 6. However, while it is preferred that the direction of air flow is as shown in FIG. 6, the direction of air flow can vary. For example, the direction of air flow can be in the reverse direction as shown in FIG. 6A.

At least one fan is used to direct air either into or out of the primary enclosure 120. For example, in FIG. 6 first and second fans 220 and 240 are shown fitted to first and second apertures 180 and 200, respectively. In FIG. 6 the first fan 220 is used to drive cooled air from the secondary enclosure 140 into the primary enclosure 120, and the second fan 240 is used to drive air heated by the electrical equipment 112 out of the primary enclosure 120 and into the secondary enclosure 140 to be cooled by the radiator 170. Pairing the operation of the first and second fans 220 and 240 in this manner sets up an efficient circulating pathway CP of air to maximize the cooling effect on the heat generating equipment 112 inside the primary enclosure 120.

While it is possible to run first and second fans 220 and 240 in reverse as shown in FIG. 6A it is preferred to run the first and second fans 220 and 240 to provide a circulating pathway of air CP as shown in FIG. 6 to provide the shortest distance between the radiator 170 and the primary enclosure 120 via first aperture 180.

It is preferred that there are at least two apertures in the internal dividing wall 160. If there was only one aperture this would mean air would have to enter and exit the same aperture, which while possible would be inefficient. It is also preferred that there is at least one fan directing heated air from the primary enclosure 120 into the secondary enclosure 140, and at least one fan directing cooled air from the secondary enclosure 140 into the primary enclosure 120. While it is possible to have just one fan operating, for example, in the first aperture 180 directing cooled air into the primary enclosure, it is preferred that there is a complementary fan in the second aperture 200 directing heated air into the secondary enclosure 140 to be cooled by the radiator 170.

The apparatus of the invention uses groundwater GW to absorb heat during hot weather from the closed loop 110, and in conversely in cold weather to provide heat to the closed loop 110. More specifically, during hot weather ground water is typically cooler than above ground structures, which being generally less resistant to hot weather conditions warm up. Electrical equipment cabinets 100 are particularly prone to overheating in hot weather conditions and hence require cooling. In contrast, during cold weather ground water is typically warmer than above ground structures, which being less resistant to cold weather conditions cool down. Electrical equipment cabinets 100 are particularly prone to very cold conditions and hence would benefit from some form of heating. The heat-generating electrical equipment 112 inside an electrical equipment cabinet 100 may be off-line or not generating enough heat to ensure optimum operating conditions inside the cabinet 100.

Figure 6B:
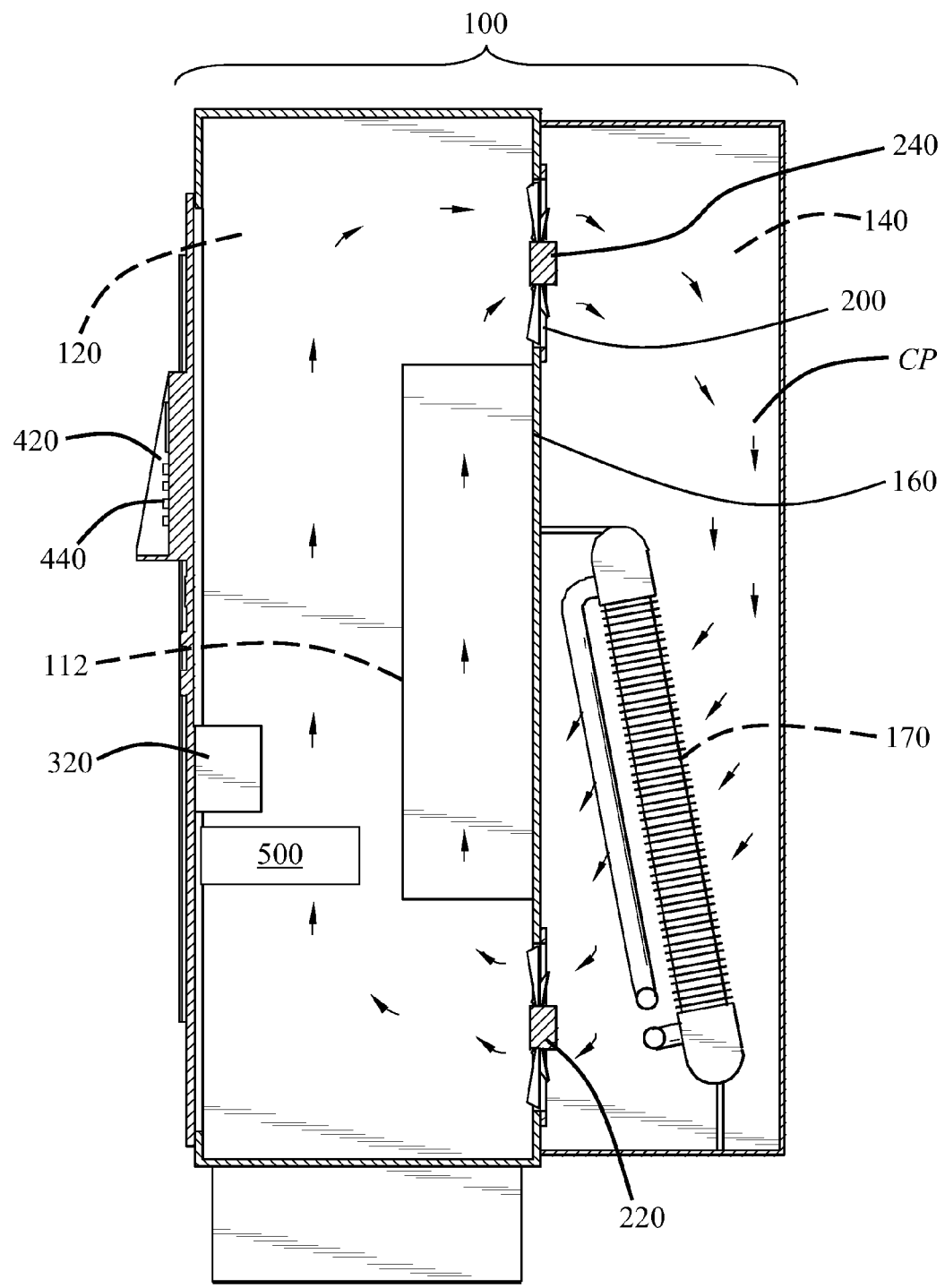
FIG. 6B shows a cross-section view of an electrical equipment cabinet setup according to the present invention.

An optional humidity control apparatus 500 (shown in FIG. 6B) can be placed inside the electrical equipment cabinet 100. Thus, should any humidity be present inside the electrical equipment cabinet 100, e.g., as the result of a service engineer opening the cabinet, the humidity can be absorbed or otherwise controlled by apparatus 500. Any suitable water moisture control technology (i.e., a device for selectively absorbing moisture) can be used such as, but not limited to, a desiccant cartridge. The apparatus 500 could be a desiccant pouch such as that described in U.S. Pat. No. 2,578,324 issued to Southwick, Jr. The apparatus 500 could be as simple as a moisture absorbent package as described in U.S. Pat. No. 3,990,872 issued to Cullen. U.S. Pat. Nos. 2,578,324 and 3,990,872 are incorporated by reference herein in their entirety.

With respect to the first embodiment, temperature fluctuations are avoided by dumping heat energy via the closed loop 110 the into groundwater during hot weather and extracting heat energy from groundwater during cold conditions thereby helping to avoid extreme temperature variations inside the electrical equipment cabinet 100. The invention also helps to avoid sharp dips in temperature inside the cabinet 100 that would otherwise occur with respect to low humidity desert like conditions where nightfall can result in rapid temperature drops in the outside air. The present invention helps to avoid temperature stress on the electrical equipment 112 by aligning the temperature inside the cabinet 100 with the groundwater temperature rather than outside air temperature.

For convenience, the present disclosure will now discuss the invention in the context of its use during hot weather conditions, but it should be noted that the invention works in reverse providing heat to the interior of electrical equipment cabinets during cold weather conditions.

The closed loop 110 comprises radiator 170, a closed-loop pump 260 for pumping working fluid around the closed loop 110, a first working fluid line 280, a second working fluid line 300, and a heat exchanger portion 340.

In summer time the first working fluid line 280 takes heated working fluid from the radiator 170 via outlet port 285 (shown in FIG. 10) and thence to the heat exchanger portion 340 of the closed loop 110, but in winter time the first working fluid line 280 takes cooled working fluid from the radiator 170 via outlet port 285 (shown in FIG. 10) and thence to the heat exchanger portion 340 of the closed loop 110.

Figure 10:
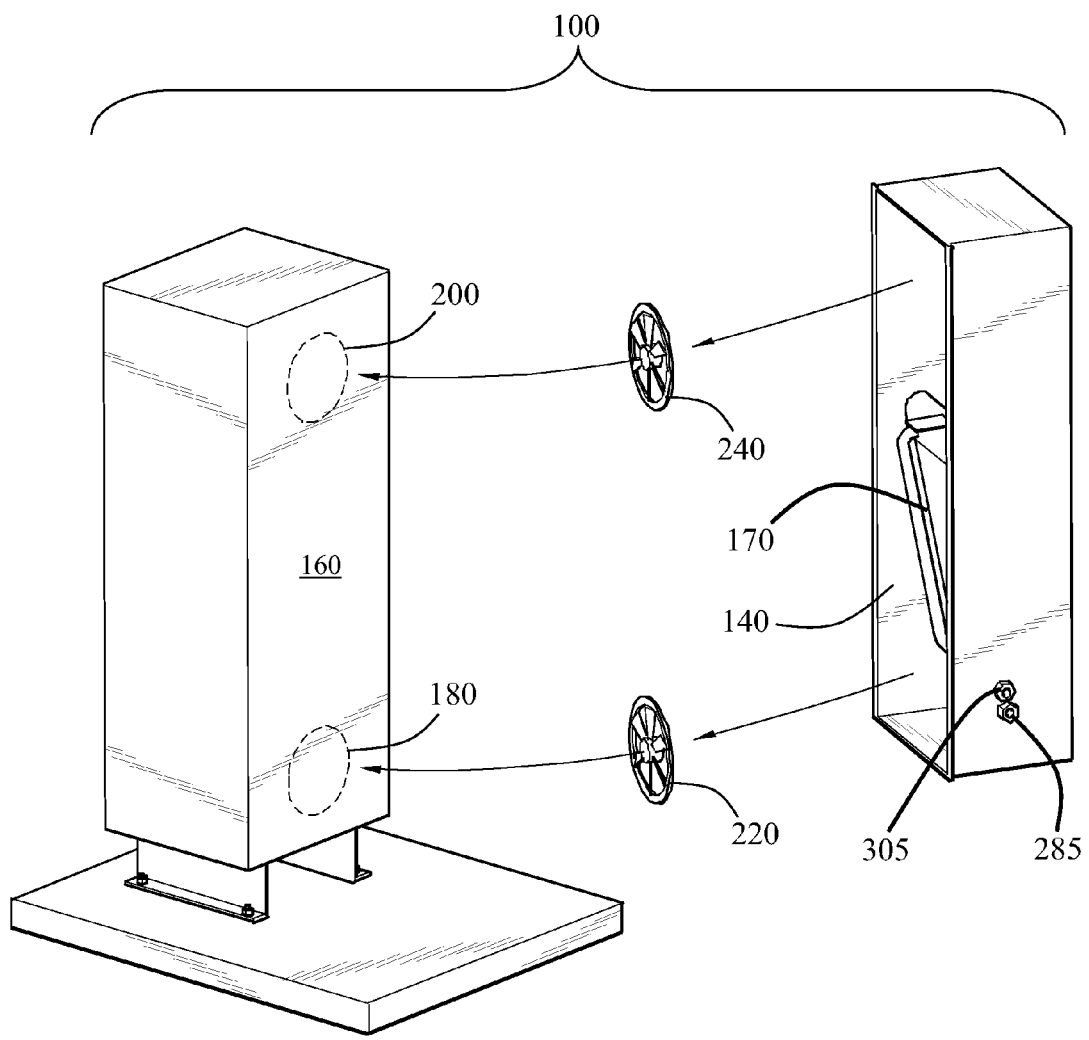
FIG. 10 shows an implementation of one aspect of the present invention.

In summer time the second working fluid line 300 feeds cooled working fluid to the radiator 170 from the heat exchanger portion 340 via inlet port 305 (shown in FIG. 10). In winter or cold weather second working fluid line 300 feeds comparatively warm working fluid to the radiator 170 from the heat exchanger portion 340 via inlet port 305.

The heat exchanger portion 340 exchanges heat energy with groundwater GW directed into or through a groundwater discharge line 360 by a groundwater pump unit 404. Groundwater GW is pumped by the groundwater pump unit 404 from a suitable groundwater source such as a drilled bore or well. Alternatively, groundwater GW can be pumped from a natural groundwater source such as, but not limited to: a natural aquifer, river or stream. The groundwater pump is made up of a ground water pump section 380 and a groundwater pump motor 400 that drives the ground water pump section 380. The location of the groundwater pump section 380 can vary. For example, the groundwater pump section 380 can be a down-hole submersible groundwater pump, e.g., located down a borehole.

Figure 9:
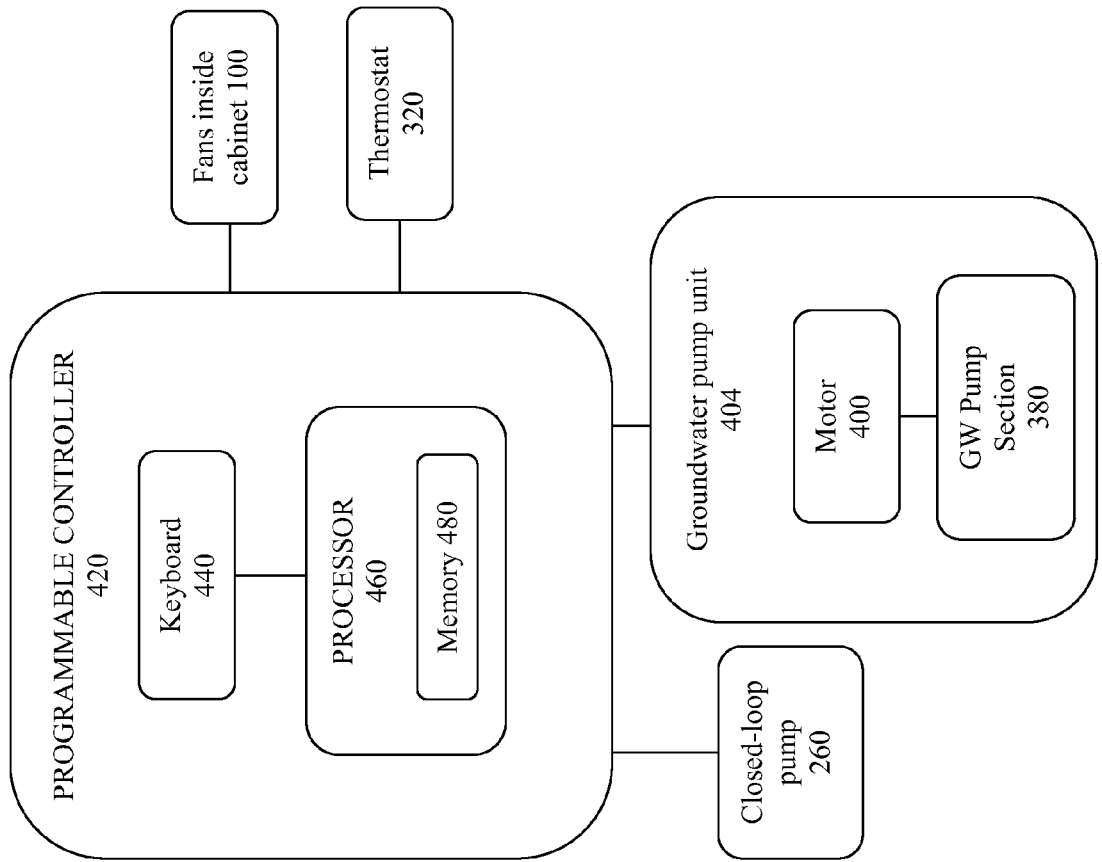
FIG. 9 shows an implementation of one aspect of the present invention.

In one embodiment the means for pumping groundwater GW into the groundwater discharge line 360 comprises a ground water pump section 380 and a groundwater pump motor 400. The motor 400 can be located in a groundwater pump motor housing 410. In another embodiment the ground water pump section 380 and motor 400 are integrated into a single groundwater pump unit 404 (FIG. 9).

In one embodiment the groundwater discharge line 360 defines an open exit end 370 such that groundwater GW is pumped into the groundwater discharge line 360 to cool or heat the heat exchanger portion 340 (and more particularly the working fluid circulating through the heat exchanger portion) and then exits the groundwater discharge line 360 via open exit end 370 and disperses on the ground surface or into a drain (not shown). In one embodiment, the groundwater discharge line 360 is lengthened such that groundwater GW is returned to the groundwater source such as an aquifer (see, e.g., FIG. 8). In the alternative, groundwater GW is recycled as shown in FIG. 7A, in this embodiment groundwater normally directed through discharge line 360 is recycled back to an aquifer.

In winter weather the groundwater GW transfers heat to the working fluid circulating through the heat exchanger portion 340 of the closed loop 110, but in summer or hot weather the groundwater GW transfers heat from the working fluid circulating through the heat exchanger portion 340 of the closed loop 110.

In one embodiment, a thermostat 320 monitors the temperature inside the primary enclosure 120. When the thermostat reports a temperature outside a predetermined temperature range the closed-loop pump 260 and fans are switched by a processor 460 (see FIG. 9) and remain on until the temperature inside the primary enclosure 120 is within the predetermined temperature range.

It should be understood that some heat generating electrical equipment 112 can also be located inside the secondary enclosure 140, but it is preferred that the majority if not all of the heat generating electrical equipment 112 is located in the primary enclosure 120 of the electrical equipment cabinet 100. If heat generating electrical equipment is located inside the secondary enclosure 140 then it is preferred that the thermostat also monitors the temperature inside the secondary enclosure 140. When the temperature inside the secondary enclosure 140 is outside a predetermined temperature range the closed-loop pump 260 and fans 220 and 240 are either on or switched on until the temperature inside the secondary enclosure 140 is within the predetermined temperature range.

The working fluid (i.e., the heat transfer fluid) pumped around the closed loop 110 by closed-loop pump 260 can be any suitable fluid. For example, the heat transfer fluid can be water. If water is used as the heat transfer fluid, the water can include additives to, for example, depress the freezing point of the working fluid (e.g., ethylene glycol), and corrosion inhibitors (e.g., hexamine, phenylenediamine, dimethylethanolamine, sodium nitrite, cinnamaldehyde) to prevent corrosion of, for example, the radiator 190 component of the closed loop 110. It should be understood that the terms "heat transfer fluid", and "working fluid" are regarded as equivalent terms.

In one embodiment a programmable controller 420 is used by an operator to enter desired temperature parameters. The programmable controller contains a processor 460. Logic on the processor 460 enables the processor to respond to temperature readings relayed from the thermostat 320 to control a ground water pump unit 404 (see FIG. 9), a closed-loop pump 260, and at least one fan located inside the electrical equipment cabinet 100 for circulating air therein.

If a slinky loop 340s is employed as part of the close loop 110, the programmable controller 420 is not required to send control signals to the ground water pump unit 404. More specifically, the groundwater pump unit 404 is omitted (see FIG. 9A).

The controller 420 is operatively coupled to a keyboard 440 to allow an operator to set the operating parameters of the closed loop 110. The controller 420 comprises a processor 460; in the alternative, the controller 420 is in operatively coupled to the processor 460. The processor 460 has sufficient memory 480 to store an algorithm to monitor the thermostat 320 and send control signals to operate the pumps 260 and motor 400 for driving the groundwater pump section 380. The location of the controller 420 and keyboard 440 can vary; while the controller 420 and keyboard 440 are shown located on housing 114 it should be understood that the controller and/or keyboard 440 can be located, for example, on a separate structure (not shown) or on the housing 410.

The electrical enclosure includes a housing 114 that serves to isolate the electrical apparatus 112 inside the electrical equipment cabinet 100 from the outside air. Thus, air-conditioning of the interior of the cabinet 100 is achieved without ducting atmospheric air into the electrical equipment cabinet 100 thereby protecting the electrical equipment 112 from contaminants that might be present in the atmospheric air outside the electrical equipment cabinet 100. The housing 114 is manufactured and fitted to avoid outside air entering the electrical equipment cabinet 100.

Prior art electrical equipment cabinets can be upgraded (i.e., retro-fitted) to the specification of the electrical equipment cabinet 100 of the present invention. For example, first and second apertures 180 and 200 can be cut out of the rear side of a prior art electrical equipment cabinet, and first and second fans 220 and/or 240 fitted to the first and second apertures 180 and 200, and the radiator 170 inside secondary enclosure 140 fitted to the rear side of a prior art electrical equipment cabinet as shown in FIG. 10. Lines 280 and 300 attached to ports 285 and 305, and the rest of the closed loop 110 is operatively coupled to the radiator 170. The controller 420 and thermostat 320 are added, and the closed loop 110 is operatively connected to a groundwater line such as the groundwater discharge line 360.

In one aspect of the present invention a method is provided for retrofitting a groundwater based geothermal air-conditioning system to an electrical equipment cabinet lacking, said method comprising the steps of:

selecting an electrical equipment cabinet having a rear side and lacking a groundwater based geothermal cooling system;

coupling a closed loop to said electrical equipment cabinet; and coupling said closed loop to a groundwater source (in the alternative said closed loop is coupled to a slinky loop).

Referring now to the Figures with regard to which the meaning of labels and numbers shown in the Figures are described in Table 1 (see FIGS. 11 and 11A).

FIG. 1 shows an elevated perspective front view of an electrical equipment cabinet setup according to the present invention. Labels and numbers shown in FIG. 1 are described in Table 1 (see FIGS. 11 and 11A).

Figure 2:
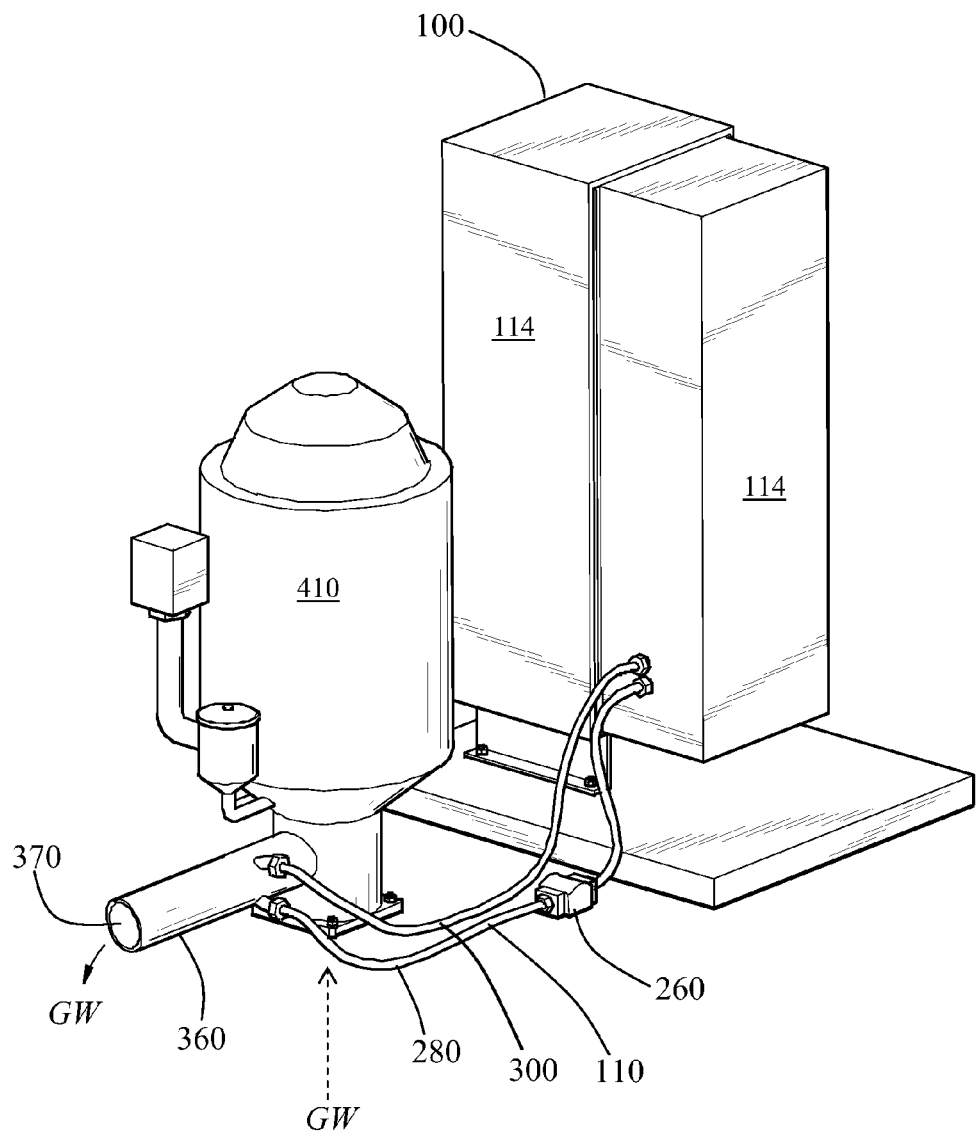
FIG. 2 shows an elevated perspective rear view of the electrical equipment cabinet setup shown in FIG. 1.

FIG. 2 shows an elevated perspective rear view of the electrical equipment cabinet setup shown in FIG. 1. Labels and numbers shown in FIG. 2 are described in Table 1 (see FIGS. 11 and 11A).

Figure 3:
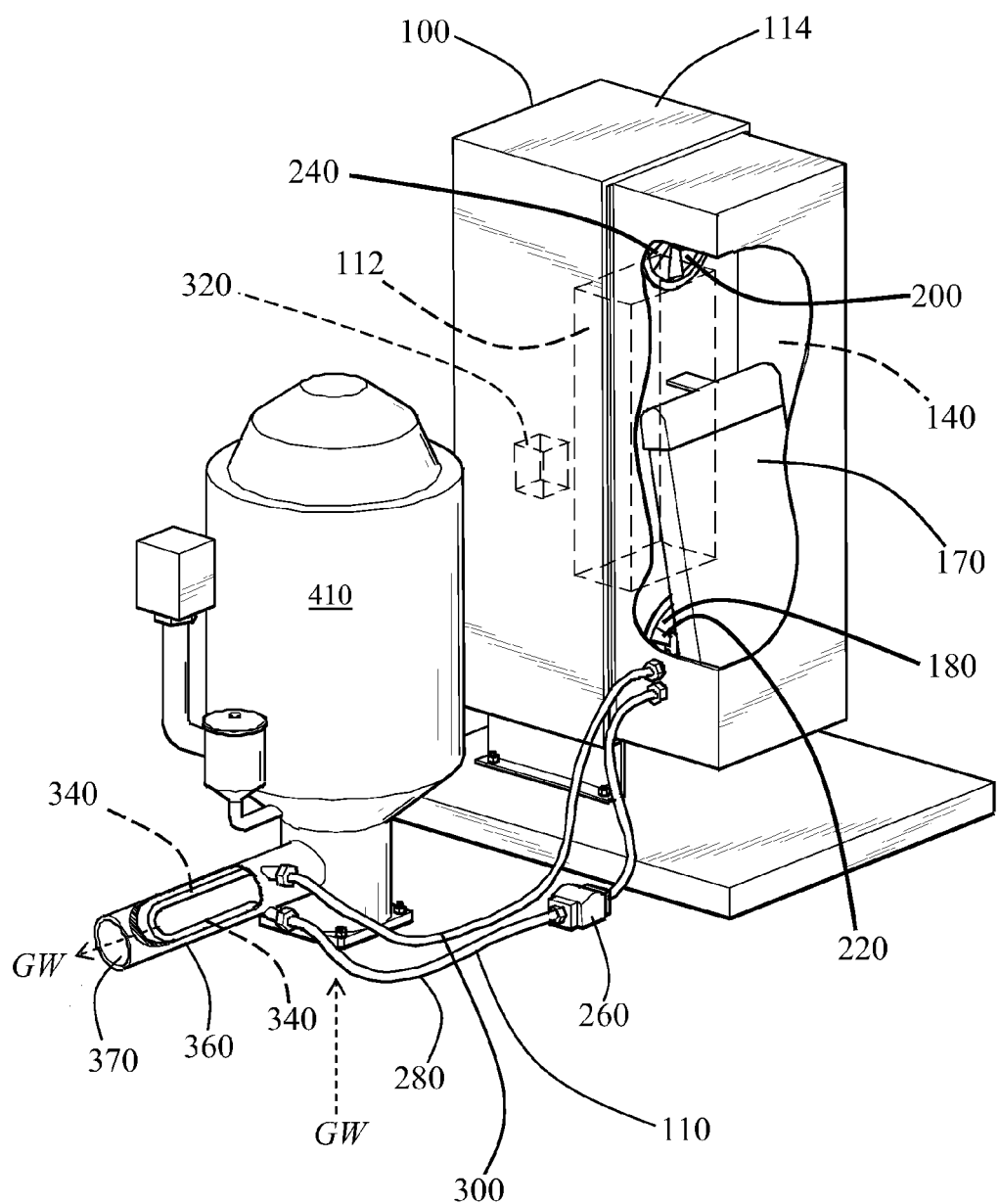
FIG. 3 shows a partially cutaway view of the electrical equipment cabinet setup shown in FIG. 2.

FIG. 3 shows a partially cutaway view of the electrical equipment cabinet setup shown in FIG. 2. Labels and numbers shown in FIG. 3 are described in Table 1 (see FIGS. 11 and 11A).

Figure 4:
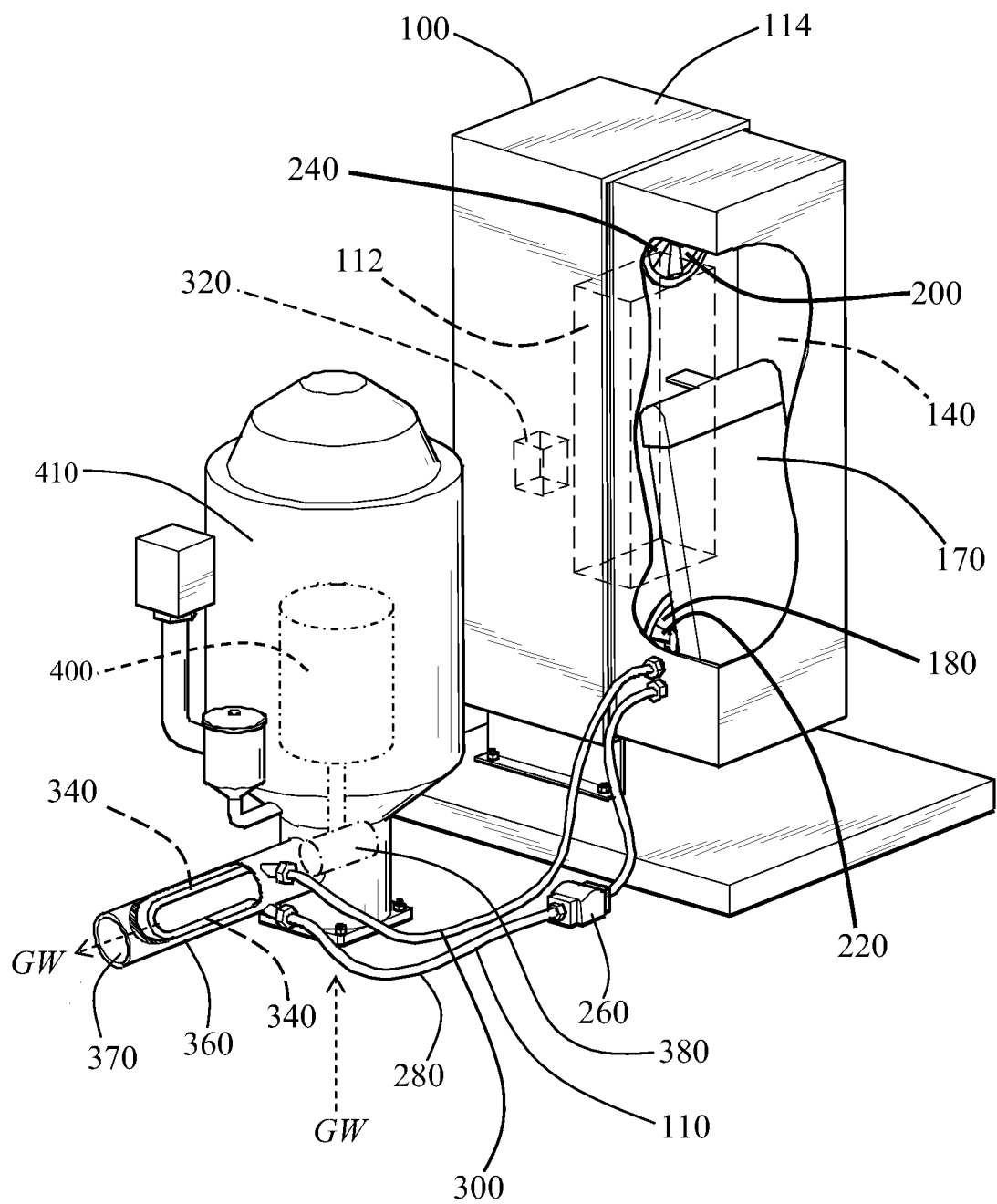
FIG. 4 shows a further cutaway view of the electrical equipment cabinet setup shown in FIG. 2.

FIG. 4 shows a further cutaway view of the electrical equipment cabinet setup shown in FIG. 2. Labels and numbers shown in FIG. 4 are described in Table 1 (see FIGS. 11 and 11A).

Figure 5:
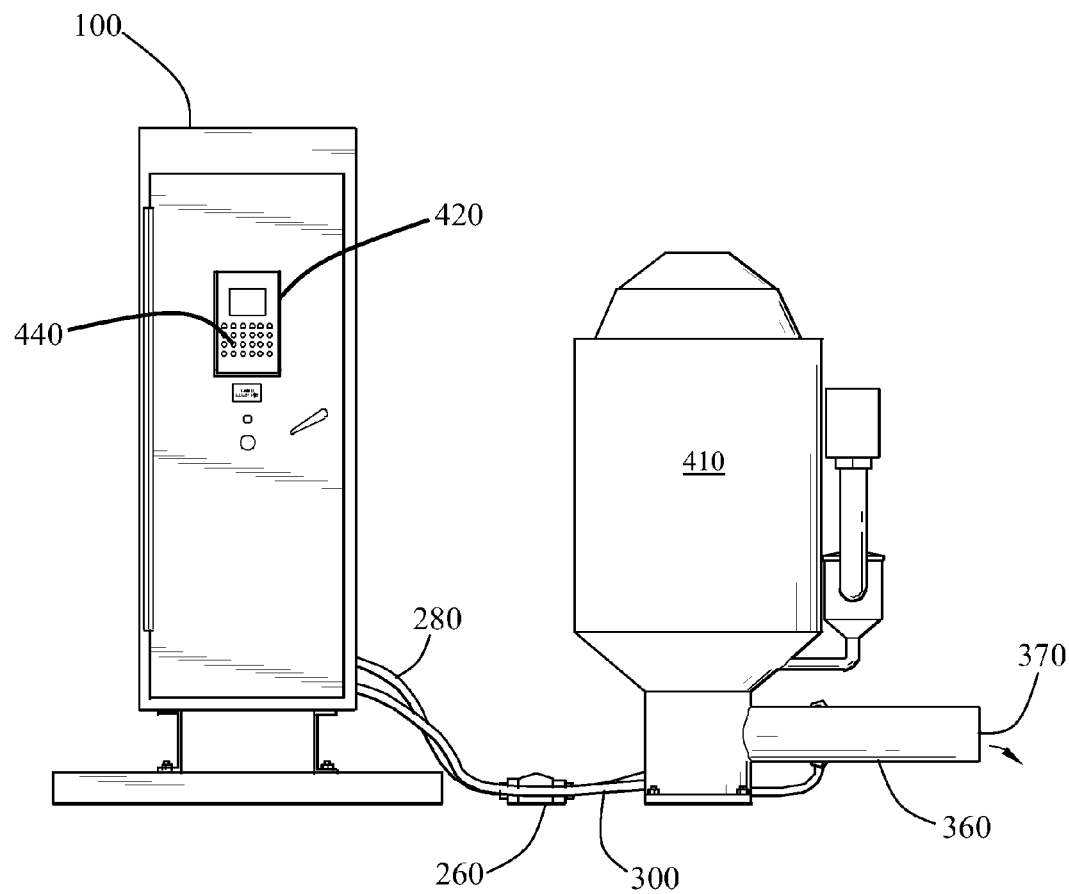
FIG. 5 shows front view of the electrical equipment cabinet setup according to the present invention.

FIG. 5 shows front view of the electrical equipment cabinet setup according to the present invention. Labels and numbers shown in FIG. 5 are described in Table 1 (see FIGS. 11 and 11A).

FIG. 6 shows a cross-section view of an electrical equipment cabinet setup according to the present invention. Labels and numbers shown in FIG. 6 are described in Table 1 (see FIGS. 11 and 11A).

Figure 7:
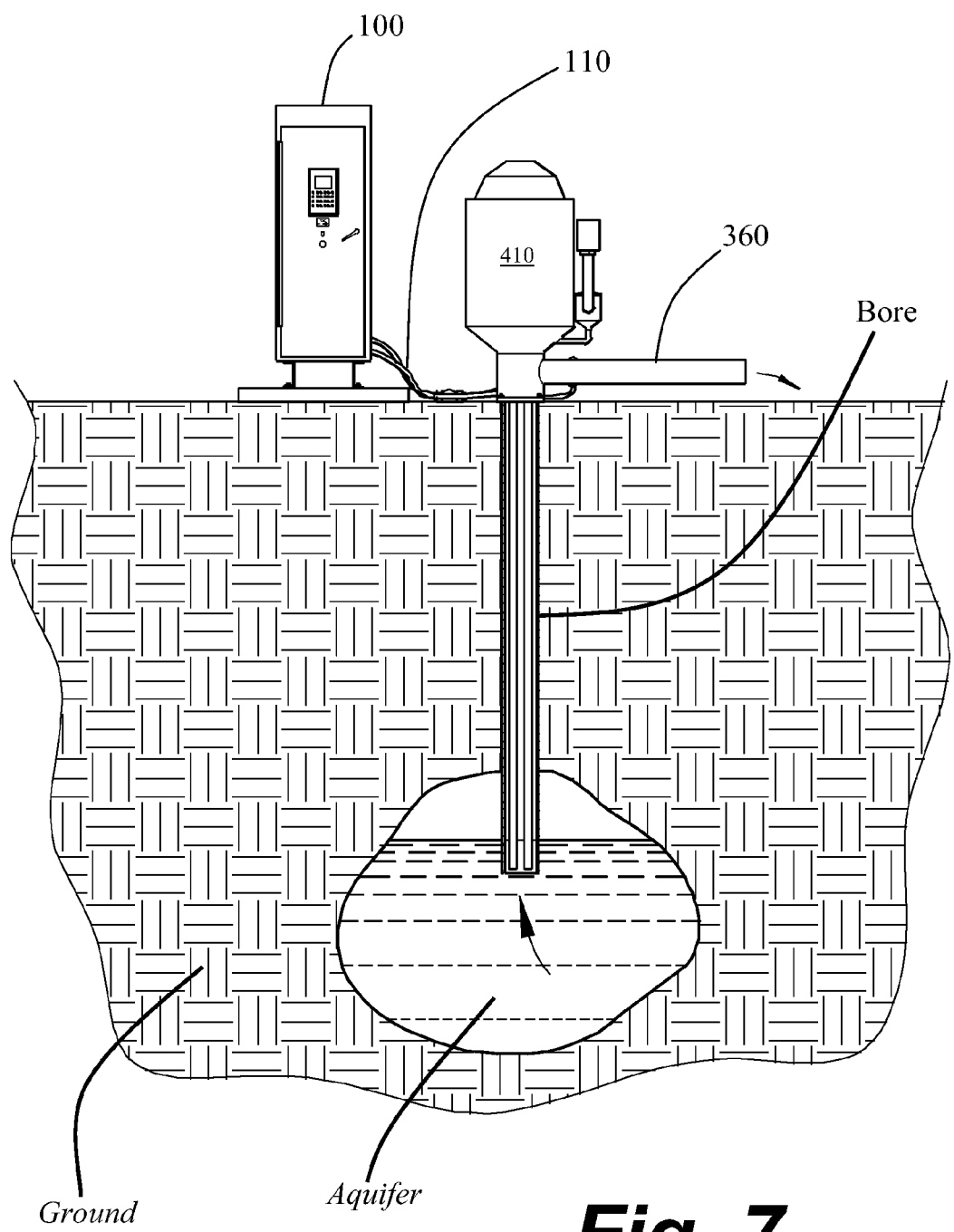
FIG. 7 shows an implementation of one aspect of the present invention.
Figure 7A:
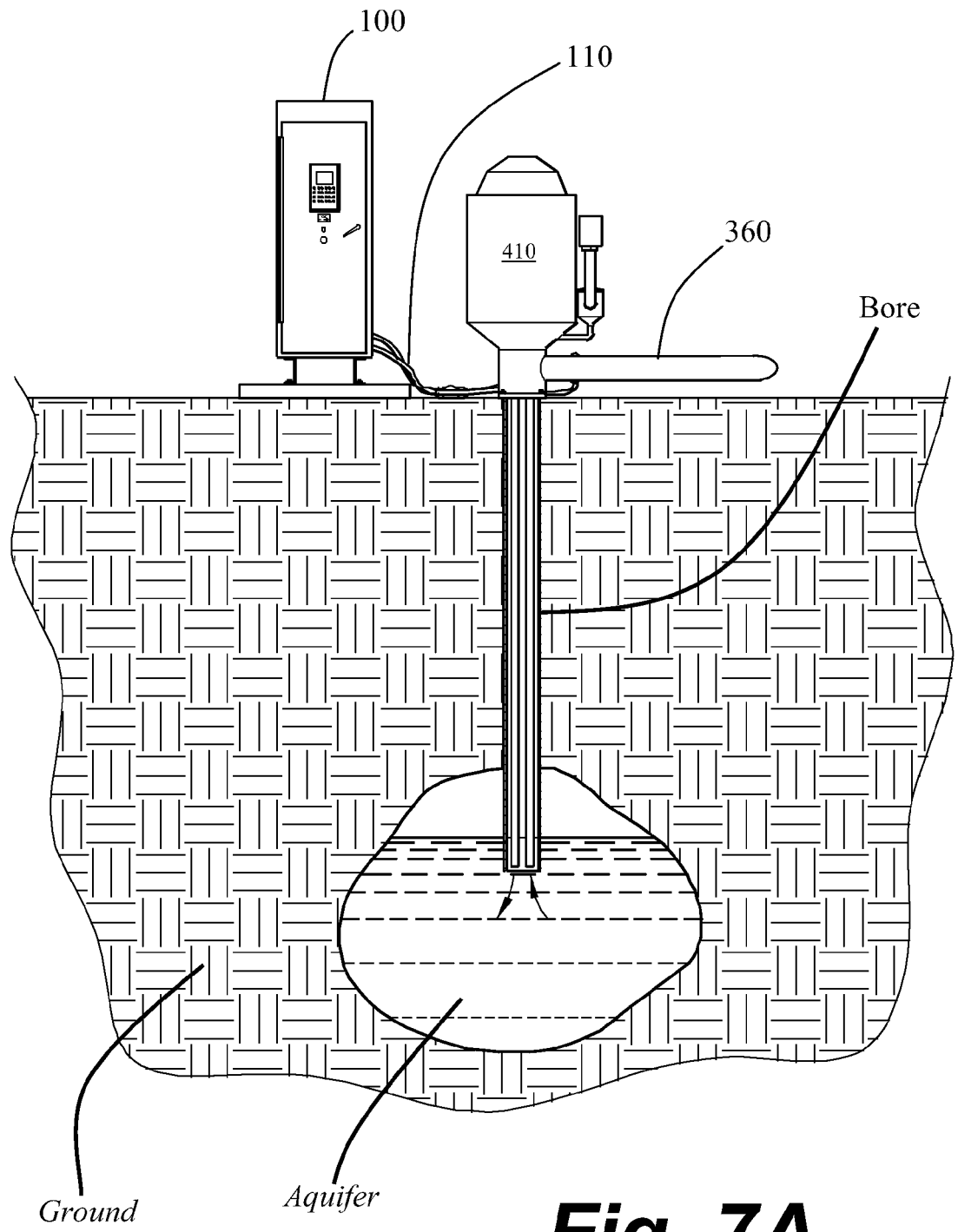
FIG. 7A shows an implementation of one aspect of the present invention.

FIG. 7 shows an implementation of one aspect of the present invention. Labels and numbers shown in FIG. 7 are described in Table 1 (see FIGS. 11 and 11A).

FIG. 7A shows an implementation of one aspect of the present invention. Labels and numbers shown in FIG. 7A are described in Table 1 (see FIGS. 11 and 11A).

Figure 8:
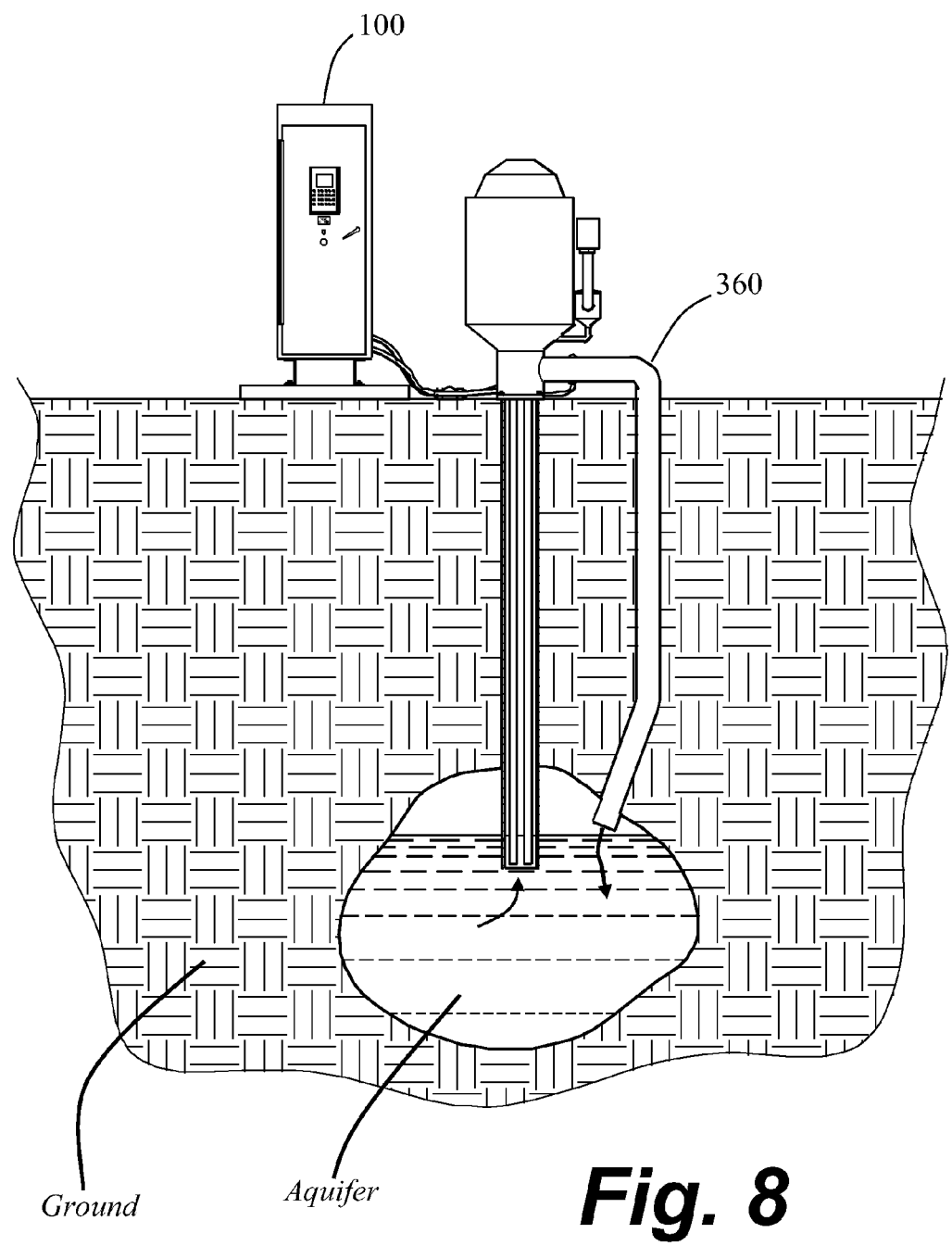
FIG. 8 shows an implementation of one aspect of the present invention.

FIG. 8 shows an implementation of one aspect of the present invention. Labels and numbers shown in FIG. 8 are described in Table 1 (see FIGS. 11 and 11A).

FIG. 9 shows an implementation of one aspect of the present invention. Labels and numbers shown in FIG. 9 are described in Table 1 (see FIGS. 11 and 11A).

Figure 9A:
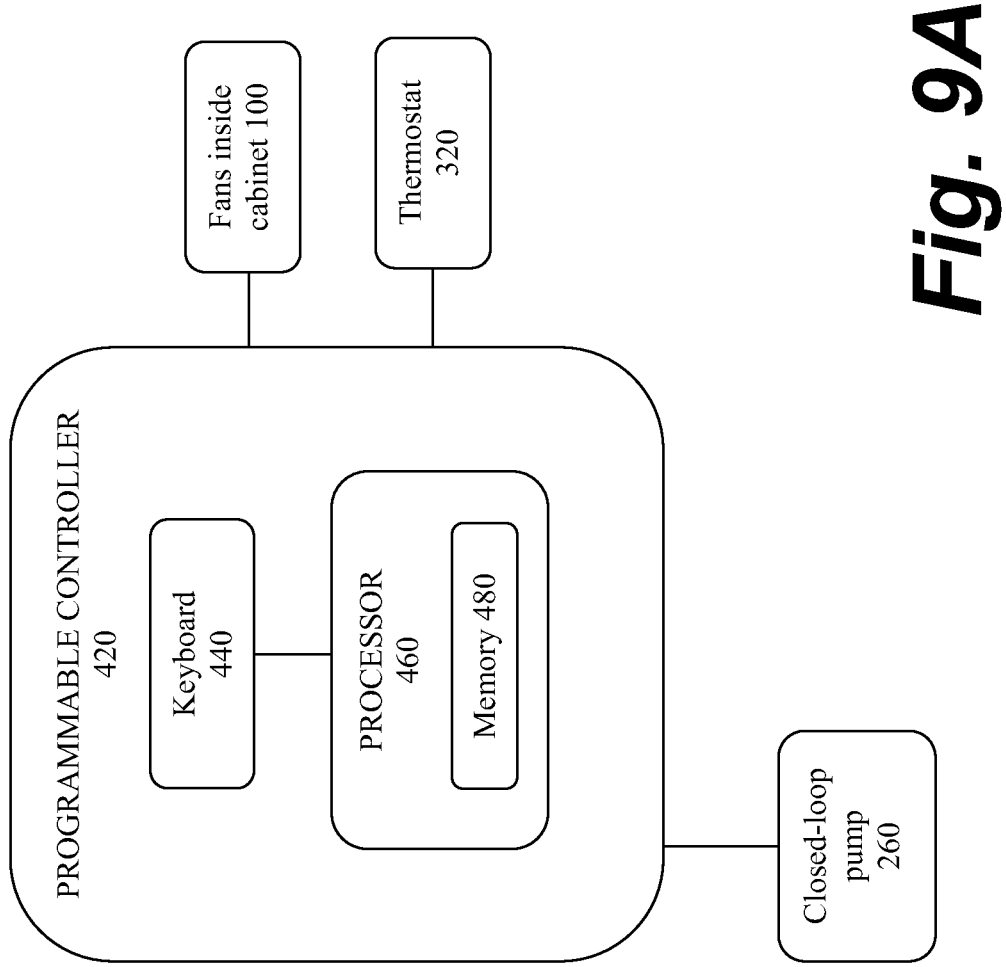
FIG. 9A shows an implementation of one aspect of the present invention.

FIG. 9A shows an implementation of one aspect of the present invention. Labels and numbers shown in FIG. 9A are described in Table 1 (see FIGS. 11 and 11A).

FIG. 10 shows an implementation of one aspect of the present invention. Labels and numbers shown in FIG. 10 are described in Table 1 (see FIGS. 11 and 11A).

FIGS. 11 and 11A show Table 1.

Figure 12:
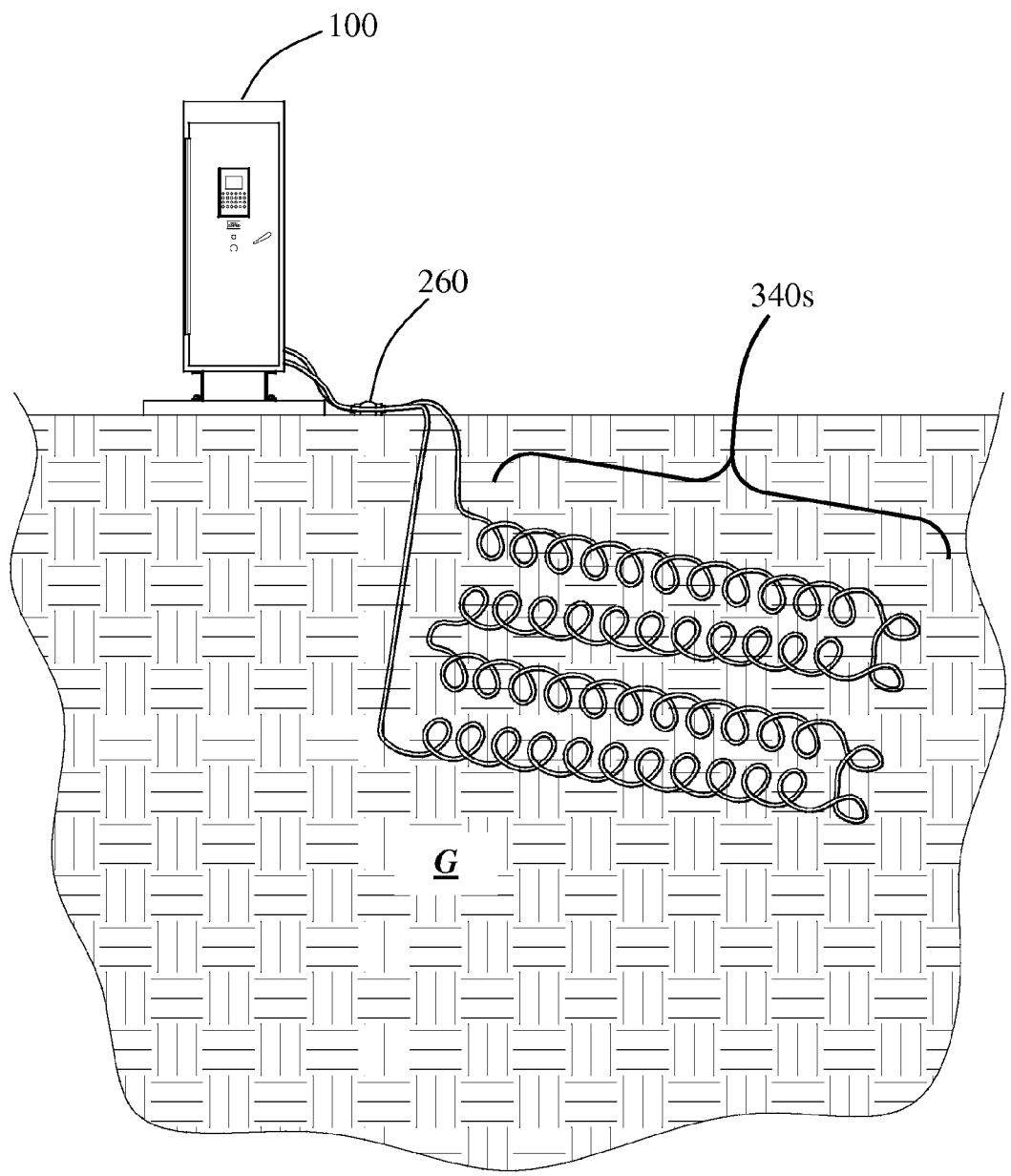
FIGS. 12 and 13 show an implementation of one aspect of the invention involving a slinky loop.
Figure 13:
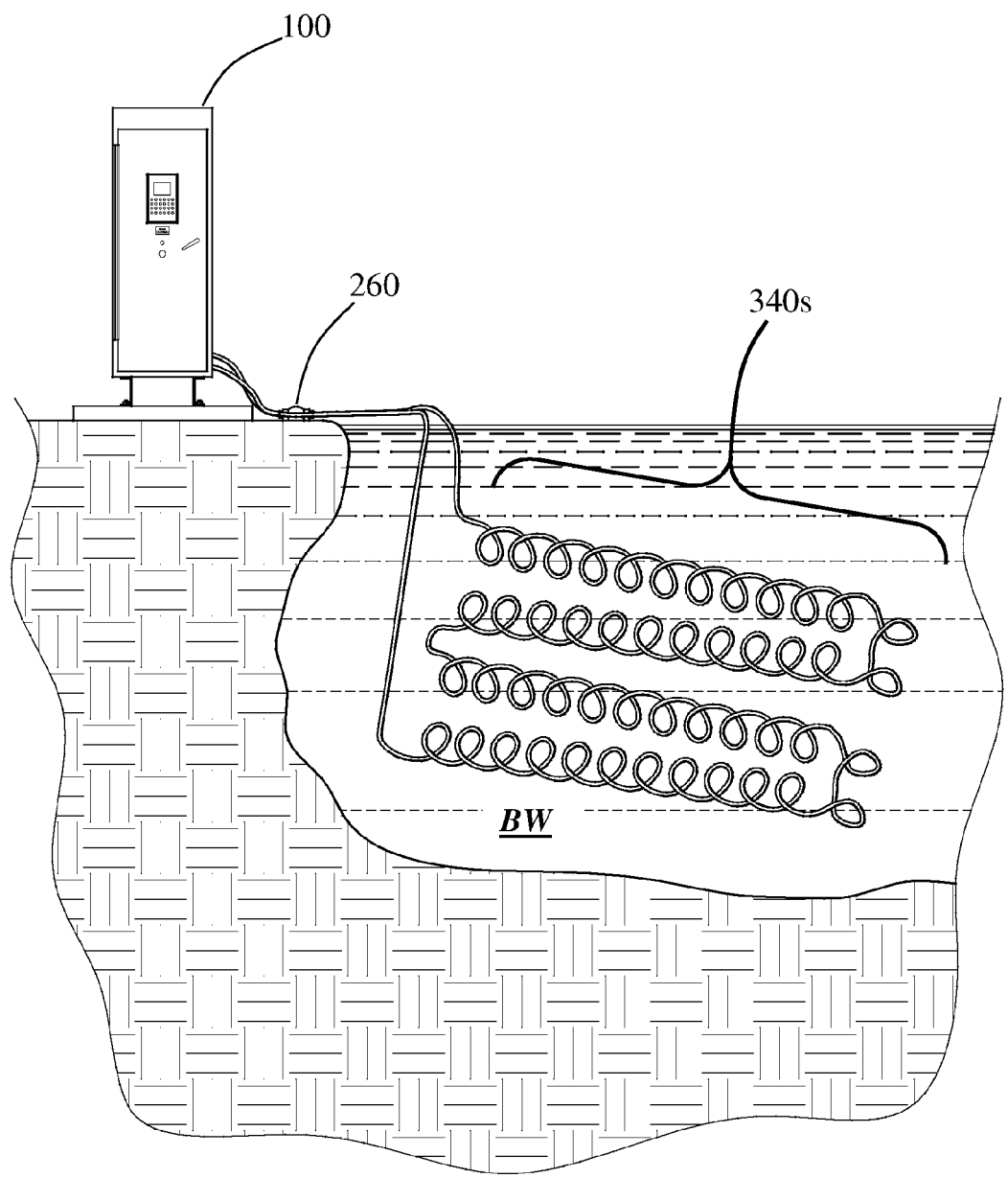

FIGS. 12 and 13 show aspects of the invention in which the closed loop 110 comprises a slinky loop 340$s$.

In the second embodiment of the present invention, the heat exchanger portion 340 is a slinky loop (see FIGS. 12 and 13) where the slinky loop version of the heat exchanger portion 340 is represented by alpha-numeric label 340$s$. The slinky loop 340$s$ can be buried in the ground G (as shown in FIG. 12) or in a body of water BW (as shown, for example, in FIG. 13) or in an artificial bore. In this embodiment the closed-loop pump 260 pumps the heat transfer fluid around the closed loop 110, which now includes the slinky loop 340$s$. In this embodiment the programmable controller 400 is not required to operate a groundwater pump unit 404.

In hot weather the slinky loop 340$s$ is used to transfer heat from the closed loop 110, and hence from the interior of the electrical equipment cabinet 100, to the ground or a body of water. In cold weather the slinky loop 340$s$ is used to transfer heat from the ground or a body of water to the closed loop 110 and thence to the interior of the electrical equipment cabinet 100.

Still referring to the second embodiment, the electrical equipment cabinet 100 can be sealed to prevent incursion of outside air into the housing 114 and the air inside the housing 114, and hence inside cabinet 100, is replaced with a gas or gas combination that lacks oxygen, for example: nitrogen or an inert gas such as a Noble gas such as helium (He), neon (Ne), argon (Ar), krypton (Kr), xenon (Xe) to further protect the electrical equipment 112 therein. More specifically, instead of air circulated around the primary 120 and secondary enclosure 140, nitrogen is circulated around the primary 120 and secondary enclosure 140 to reduce oxidation of the interior of the housing and to reduce oxidation of circuits that form part of the electrical equipment 112. Alternatively, an inert gas such as a Noble gas is circulated around the primary 120 and secondary enclosure 140.

It is to be understood that the present invention is not limited to the embodiments described above or as shown in the attached figures, but encompasses any and all embodiments within the spirit of the legal doctrine of equivalence.

What is claimed:

1. A geothermal based air-conditioning system for controlling the temperature of a remotely located electrical equipment cabinet, comprising:

an electrical equipment cabinet having a housing, said electrical equipment cabinet comprising:
  a primary enclosure, said primary enclosure contains heat-generating electrical equipment,
  a secondary enclosure having a bottom side,
    wherein said primary and secondary enclosures are adjacent to each other and separated by an internal dividing wall, said primary and secondary enclosures each having an interior filled with air,
    wherein said secondary enclosure includes an air penetrable radiator located in said secondary enclosure, where said radiator leans away at a downward acute angle from said dividing wall towards said bottom of said secondary enclosure, and
  first and second apertures located in said dividing wall, said first and second apertures are respectively fitted with first and second fans, said first and second fans are paired such that one drives air directly into said secondary enclosure from said primary enclosure, and the other fan drives air from said secondary enclosure directly into said primary enclosure to provide a circulating pathway directly between said primary and secondary enclosures;

a thermostat for monitoring the temperature in said primary enclosure;

a programmable controller;

a closed loop, said closed loop comprising: said radiator, a first working fluid line, a second working fluid line, a heat exchanger portion, and a closed-loop pump for pumping working fluid around said closed loop;

a groundwater motor housing containing a groundwater pump motor operably connected to said closed-loop pump; and a cylindrical groundwater discharge pipe extending laterally from the base of said groundwater motor housing, said ground water discharge pipe encloses said heat exchanger portion of said closed loop, wherein said first and second working fluid lines are connected to said groundwater discharge pipe through corresponding side ports in said groundwater discharge pipe, said side ports extend perpendicularly to the flow of groundwater in said groundwater discharge pipe, wherein said working fluid line transmits fluid to said heat exchanger portion through one of said corresponding side ports and said second working fluid line carries fluid from said heat exchanger portion through another of said corresponding side ports, wherein during normal operation groundwater is directed onto said heat exchanger portion, such that said heat exchanger portion is immersed in said groundwater as said groundwater flows through said groundwater discharge pipe, wherein the groundwater pump motor and close-loop pump are collectively configured to pump ground water into said groundwater discharge pipe.

2. The geothermal based air-conditioning system of claim 1, wherein said electrical equipment cabinet has an interior filled with nitrogen in place of air, and wherein said air penetrable radiator directly heats or cools the nitrogen.

3. The geothermal based air-conditional system of claim 1, wherein said electrical equipment cabinet has an interior filled with a Nobel gas in place of air, and wherein said air penetrable radiator directly heats or cools the Nobel gas.

4. The geothermal based air-conditioning system of claim 1, further comprising an apparatus positioned inside said electrical equipment cabinet for absorbing water moisture inside said electrical equipment cabinet.

5. The geothermal based air-conditioning system of claim 1, wherein pumping groundwater into said groundwater discharge pipe cools the working fluid circulating through said heat exchanger portion.

6. The geothermal based air-conditioning system of claim 1, wherein pumping groundwater into said groundwater discharge pipe warms the working fluid circulating through said heat exchanger portion.

* * * * *